(12) United States Patent
Husain et al.

(10) Patent No.: US 8,633,561 B2
(45) Date of Patent: Jan. 21, 2014

(54) TERMINATION FOR A SUPERJUNCTION DEVICE

(75) Inventors: Ali Husain, Los Angeles, CA (US); Srinkant Sridevan, Redondo Beach, CA (US)

(73) Assignee: Siliconix Technology C. V., Singapore (SG)

( * ) Notice: Subject to any disclaimer, the term of this patent is extended or adjusted under 35 U.S.C. 154(b) by 191 days.

(21) Appl. No.: 12/703,109

(22) Filed: Feb. 9, 2010

(65) Prior Publication Data

US 2010/0230775 A1    Sep. 16, 2010

Related U.S. Application Data

(63) Continuation of application No. 11/698,373, filed on Jan. 26, 2007, now Pat. No. 7,659,588.

(60) Provisional application No. 60/762,793, filed on Jan. 26, 2006.

(51) Int. Cl.
   *H01L 29/06*    (2006.01)

(52) U.S. Cl.
   USPC .... 257/487; 257/401; 257/478; 257/E29.005; 257/369; 257/E21.04

(58) Field of Classification Search
   USPC .................. 257/135–136, 242, 329, E27.091, 257/E27.095, E29.118, E29.274, E29.313, 257/E29.318, E29.262
   See application file for complete search history.

(56) References Cited

U.S. PATENT DOCUMENTS

| | | |
|---|---|---|
| 5,365,085 A | 11/1994 | Tokura et al. |
| 6,040,600 A | 3/2000 | Uenishi et al. |
| 6,300,171 B1 | 10/2001 | Frisina |
| 6,353,252 B1 | 3/2002 | Yasuhara et al. |
| 6,410,958 B1 | 6/2002 | Usui et al. |
| 6,441,455 B1 | 8/2002 | Dutta |
| 6,498,368 B2 | 12/2002 | Sakamoto et al. |
| 6,509,240 B2 | 1/2003 | Ren et al. |
| 6,541,817 B1 | 4/2003 | Hurkx et al. |
| 6,605,862 B2 | 8/2003 | Van Dalen et al. |
| 6,621,122 B2 | 9/2003 | Qu |
| 6,674,126 B2 | 1/2004 | Iwamoto et al. |
| 6,683,347 B1 | 1/2004 | Fujihira |
| 6,700,141 B2 | 3/2004 | Iwamoto et al. |
| 6,713,813 B2 | 3/2004 | Marchant |
| 6,724,042 B2 * | 4/2004 | Onishi et al. .................. 257/341 |
| 6,740,931 B2 | 5/2004 | Kouzuki et al. |
| 6,762,455 B2 | 7/2004 | Oppermann et al. |

(Continued)

FOREIGN PATENT DOCUMENTS

| | | |
|---|---|---|
| EP | 1114466 | 7/2001 |
| JP | 11348355 | 12/1999 |

(Continued)

OTHER PUBLICATIONS

Translation of a portion of the Office Action for Japanese Patent Application No. 2004-306311.

(Continued)

*Primary Examiner* — Mamadou Diallo

(57) ABSTRACT

A superjunction device that includes a termination region having a transition region adjacent the active region thereof, the transition region including a plurality of spaced columns.

20 Claims, 6 Drawing Sheets

(56) References Cited

U.S. PATENT DOCUMENTS

| | | |
|---|---|---|
| 6,764,906 B2 | 7/2004 | Darwish |
| 6,768,170 B2 | 7/2004 | Zhou |
| 6,828,609 B2 | 12/2004 | Deboy et al. |
| 6,849,900 B2 | 2/2005 | Aida et al. |
| 6,979,862 B2 | 12/2005 | Henson |
| 7,019,358 B2 * | 3/2006 | Amato ............................ 257/328 |
| 7,166,890 B2 | 1/2007 | Sridevan |
| 7,372,111 B2 * | 5/2008 | Onishi et al. ................... 257/401 |
| 7,492,003 B2 | 2/2009 | Kinzer |
| 7,659,588 B2 | 2/2010 | Husain et al. |
| 7,767,500 B2 | 8/2010 | Sridevan |
| 2001/0052601 A1 | 12/2001 | Onishi et al. |
| 2002/0063281 A1 | 5/2002 | Tihanyl |
| 2003/0176031 A1 * | 9/2003 | Onishi et al. ................... 438/200 |
| 2003/0219933 A1 | 11/2003 | Yamauchi et al. |
| 2004/0016959 A1 | 1/2004 | Yamaguchi et al. |
| 2004/0038467 A1 | 2/2004 | Darwish et al. |
| 2004/0150039 A1 | 8/2004 | Henson |
| 2004/0150040 A1 | 8/2004 | Nitta et al. |
| 2004/0227182 A1 | 11/2004 | Darwish et al. |
| 2004/0245570 A1 | 12/2004 | Ninomiya |
| 2005/0082570 A1 | 4/2005 | Sridevan |
| 2005/0133859 A1 | 6/2005 | Kuwahara et al. |
| 2005/0181577 A1 * | 8/2005 | Hshieh ............................ 438/427 |
| 2005/0221547 A1 | 10/2005 | Yamauchi et al. |
| 2006/0226494 A1 | 10/2006 | Hshieh |
| 2006/0281249 A1 | 12/2006 | Yilmaz et al. |
| 2007/0173021 A1 * | 7/2007 | Kocon et al. ................... 438/270 |
| 2007/0222025 A1 | 9/2007 | Husain et al. |

FOREIGN PATENT DOCUMENTS

| | | |
|---|---|---|
| JP | 2001313391 | 11/2001 |
| JP | 200374951 | 6/2002 |
| JP | 2006-511974 | 4/2006 |
| WO | 2006/135746 | 12/2006 |

OTHER PUBLICATIONS

Application as Filed; U.S. Appl. No. 60/761,701; Daniel M. Kinzer; filed Jan. 24, 2006.

* cited by examiner

TERMINATION FOR A SUPERJUNCTION DEVICE

RELATED APPLICATION

This application is a continuation of a co-pending, commonly-owned patent application Ser. No. 11/698,373, filed on Jan. 26, 2007, entitled "TERMINATION FOR A SUPERJUNCTION DEVICE," by Husain et al., and claims the benefit and priority thereto. The patent application Ser. No. 11/698,373 is incorporated herein by reference in its entirety. patent application Ser. No. 11/698,373 claims a benefit and priority to a Provisional Patent Application No. 60/762,793, filed on Jan. 26, 2006.

BACKGROUND OF THE INVENTION

The present invention relates to power semiconductor devices and more particularly to a termination arrangement for a superjunction power semiconductor device.

A superjunction arrangement having a cellular design in the active region thereof can be terminated with dense p-columns as a transition to a race-track structure. The weak point of the device with respect to avalanche breakdown is at the interface between the active cells and the dense p-columns in the transition region. Conventional designs utilize a transition region having a hexagonal lattice similar to the hexagonal lattice of the active cells, but with half the lattice constant and, crucially, offset. The offset breaks the symmetry in some lattice directions resulting in weak points where the device is more susceptible to avalanche breakdown.

SUMMARY OF THE INVENTION

According to the present invention, the interface can be rendered denser to improve the breakdown voltage by starting from a basic hexagonal lattice pattern derived from the hexagonal lattice pattern of the active cells of the active area.

The breakdown voltage of the termination of a superjunction power semiconductor device having a semiconductor body of one conductivity, an active region formed in the semiconductor body, and a termination region having a transition region adjacent the active region can be improved by forming a termination region having a transition region adjacent the active region, the transition region including a plurality of columns of another conductivity in the semiconductor body, a cross-section taken normal to the longitudinal axes of the columns having a pattern in which one group of the columns are disposed at corners of a hexagon, one of the columns is disposed at the centroid of the hexagon, the columns at the corners and the column at the centroid forming a plurality of equilateral triangles, each triangle including the column at the centroid at one corner thereof, and two columns at the other corners thereof, and another group of the columns each being positioned equidistant from another two oppositely disposed columns at corners of an equilateral triangle.

In one embodiment, each column from the another group is positioned on a side of a respective equilateral triangle.

In another embodiment, each column from the another group is positioned at the centroid of a respective equilateral triangle.

A pattern may also be generated by combining the first embodiment and the second embodiment, whereby the another group of columns includes a first set of columns and a second set of columns, each column in the first set of columns positioned on a side of a respective equilateral triangle, and each column in the second set of columns disposed at the centroid of a respective equilateral triangle.

Alternatively, a pattern may be generated by repeating the first embodiment twice whereby the another group of columns includes a first set of columns and a second set of columns, each column in the first set of columns positioned on a side of a respective equilateral triangle forming a second equilateral triangle, and each column in the second set of columns disposed at a side of a respective second equilateral triangle.

Or, a pattern may be generated by repeating the second embodiment twice whereby the another group of columns includes a first set of columns and a second set of columns, each column in the first set of columns positioned at the centroid of a respective equilateral triangle each two forming a second equilateral triangle with a column of the hexagon, and each column in the second set of columns disposed at the centroid of a respective second equilateral triangle.

Thus, a power semiconductor device according to the present invention includes a semiconductor body of one conductivity, an active region formed in the semiconductor body, and a termination region having a transition region adjacent the active region that includes a plurality of columns of another conductivity formed in the semiconductor body, a cross-section of the columns taken normal to the longitudinal axes of the columns having a pattern in which one group of the columns are disposed at corners of a hexagon, one of the columns is disposed at the centroid of the hexagon, the columns at the corners and the column at the centroid forming a plurality of equilateral triangles, each triangle including the column at the centroid at one corner thereof, and two columns at the other corners thereof, and another group of the columns each being positioned equidistant from another two oppositely disposed columns at corners of an equilateral triangle.

In a first embodiment of the present invention, each column in the another group of columns is disposed on a side of a respective equilateral triangle.

In a second embodiment of the present invention, each column in the another group of columns is disposed at the centroid of a respective equilateral triangle.

The features of the first and the second embodiment can be combined such that the another group of columns includes a first set of columns and a second set of columns, each column in the first set of columns is disposed on a side of a respective equilateral triangle, and each column in the second set of columns is disposed at the centroid of a respective equilateral triangle.

Other features and advantages of the present invention will become apparent from the following description of the invention which refers to the accompanying drawings.

DETAILED DESCRIPTION OF THE FIGURES

Figure 1:
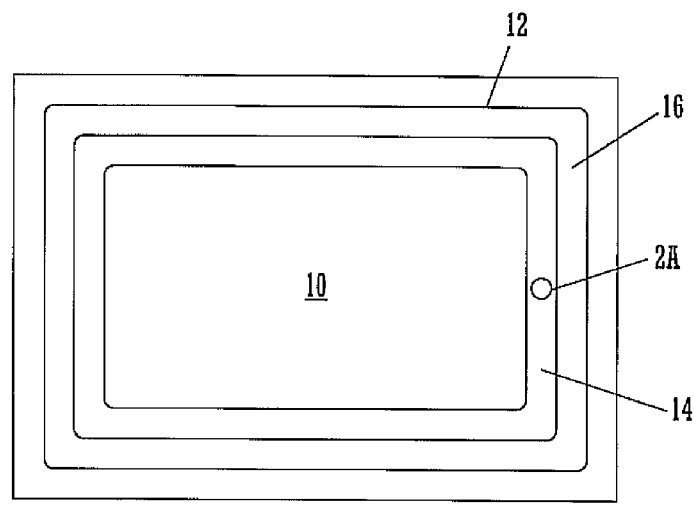
FIG. 1 illustrates schematically a top plan view of a device according to the prior art.

Referring to FIG. 1, a typical power semiconductor MOSFET having a superjunction arrangement includes active region 10, and a termination region 12 adjacent active region 10. Both active region 10 and termination region 12 are formed in a semiconductor body of one conductivity (e.g. N-type). Termination region 12 includes a transition region 14 adjacent active region 10 and region 16 that is comprised of a plurality of annular, continuous, and spaced rings of another conductivity, e.g. p-type, (sometimes referred to as a "race track" termination). Region 16 is disposed adjacent transition region 14 and the edges of the power device.

Figure 2A:
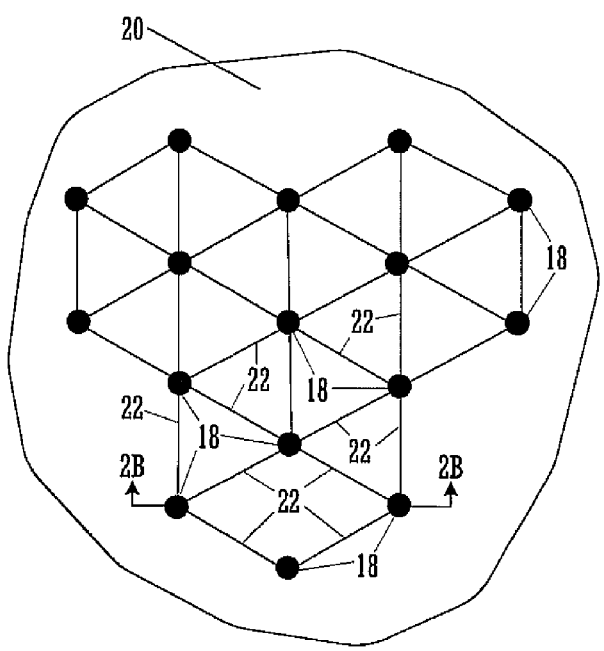
FIG. 2A illustrates an enlarged top plan view of section 2A in FIG. 1.
Figure 2B:
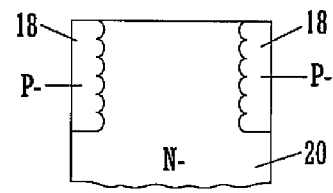
FIG. 2B illustrates a cross-sectional view along line 2B-2B in FIG. 2A viewed in the direction of the arrows.

Referring now to FIG. 2A, transition region 14 includes a plurality of columns 18 of another conductivity (e.g. P-type), opposite to the one conductivity of semiconductor body 20, in which columns 18 are formed. Note that columns 18 are usually about the same width and extend to about the same depth. Note that FIG. 2A illustrates a cross-section normal to the vertical axes of columns 18 as formed in semiconductor body 20. As illustrated, columns 18 are arranged such that a column is disposed at a respective corner of a hexagon, while one column 18 is disposed at the centroid of the hexagon. One such hexagonal pattern is identified for illustrative purposes by connecting lines 22, which should not be understood to represent any physical structural feature in the device. Note that, each hexagon can be divided into six equilateral triangles each having a column at a corner thereof, at least one of which is a column 18 at the centroid of the hexagon.

In a device according to the present invention transition region 14 is modified to have columns arranged in a pattern according to one of the embodiments described below. A device according to the preferred embodiment will include an active region 10, and region 16 as described above.

Figure 3A:
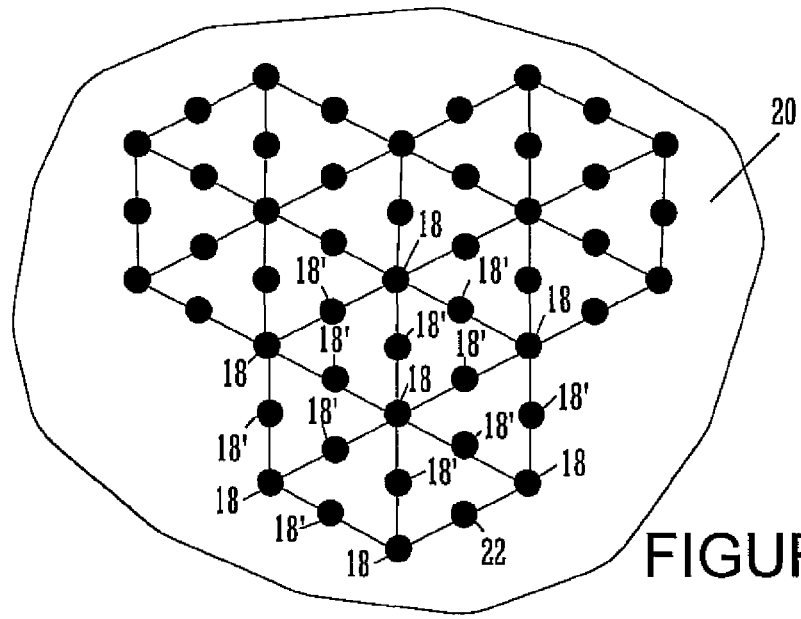
FIG. 3A illustrates a portion of the transition region in the termination region of a device according to the first embodiment of the present invention.

FIG. 3A illustrates the result of a transformation (hereafter A transformation) to generate a pattern of columns 18, 18' according to the first embodiment of the present invention. According to the first embodiment, the location for each column 18' is selected to be equidistant from at least two columns 18 at the end of each side of an equilateral triangle having column 18 at the centroid of a hexagon at one corner thereof. Thus, in a device according to the first embodiment of the present invention, a column 18' of another conductivity is disposed on a side of each equilateral triangle equidistant from columns 18 at the respective ends of the side. As a result, each triangle would include three columns 18 at a respective corner thereof, and three columns 18' each on a respective side thereof. Note that columns 18' may be the same width, the same depth of, and the same resistivity as columns 18.

Figure 3B:
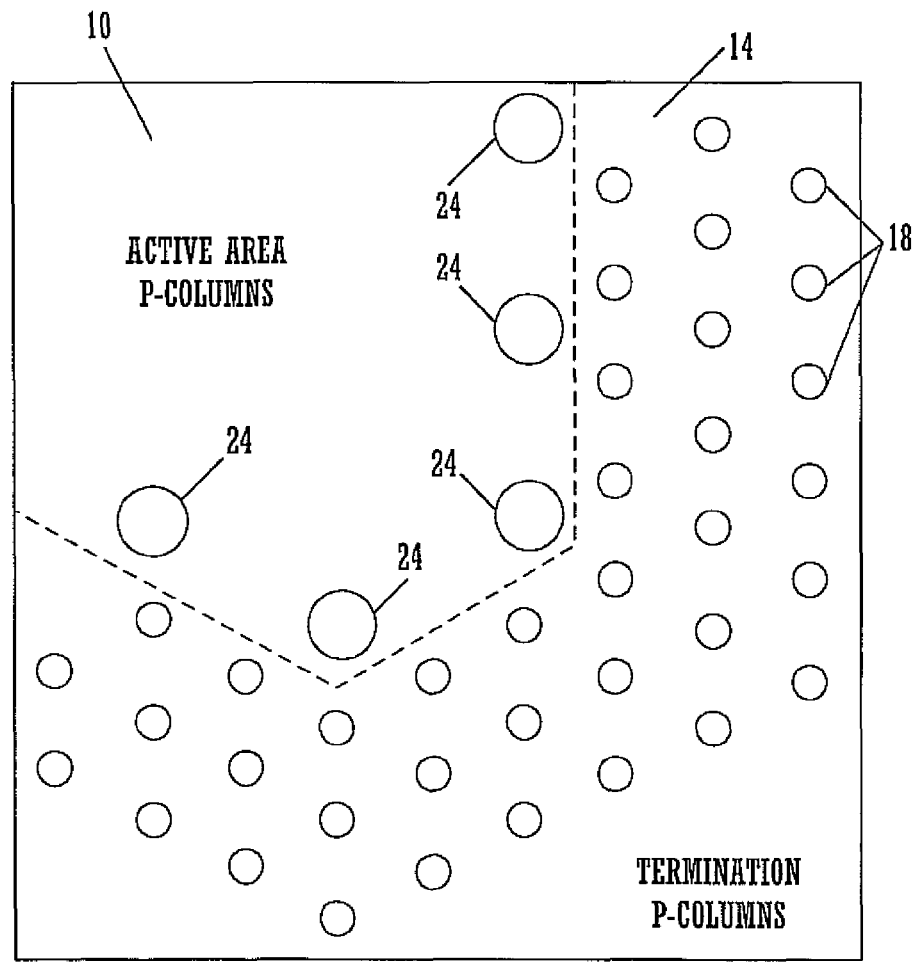
FIG. 3B illustrates a portion of the transition region according to the first embodiment adjacent the active region of the device.

FIG. 3B illustrates a portion of transition region 14 patterned according to transition A alongside of active region 10 of a device according to the present invention. Note that because a device according to the present invention is a superjunction device active region 10 thereof may also include columns 24 of the another conductivity formed in semiconductor body of the one conductivity. Columns 24 are in substantial charge balance as is well known to result in a superjunction arrangement. Also, note that columns 24 may be wider, and in some cases deeper than columns 18, 18' in transition region 14.

Figure 4A:
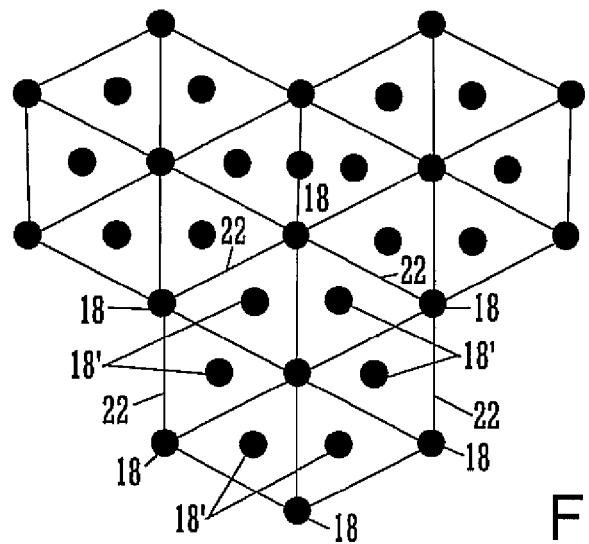
FIG. 4A illustrates a portion of the transition region in the termination region of a device according to the second embodiment of the present invention.

Referring now to FIG. 4A, in a transformation (hereafter transformation B) according to the second embodiment of the present invention columns 18' of the another conductivity are disposed at the centroid of each equilateral triangle that forms the basic hexagon pattern described above.

Figure 4B:
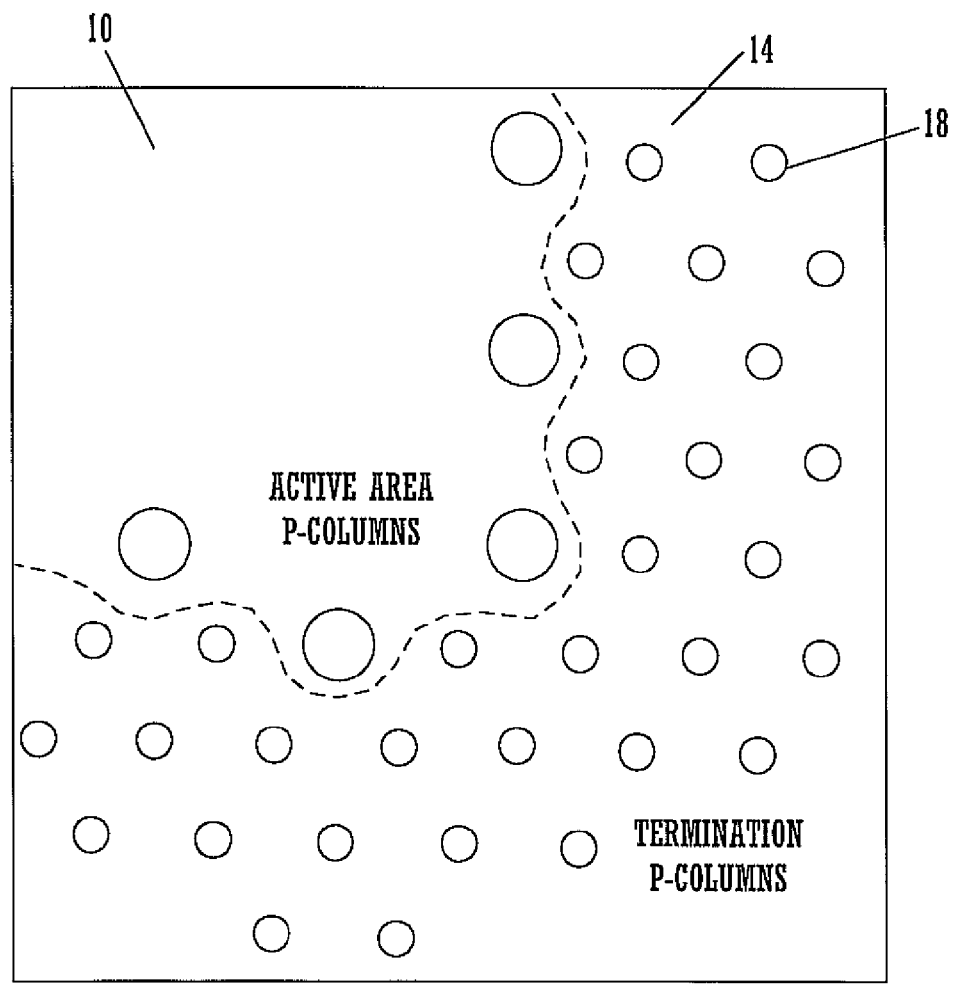
FIG. 4B illustrates a portion of the transition region according to the second embodiment adjacent the active region of the device.

Each column 18' due to its position is equidistant from all three columns 18 at the corners of the triangle. Thus, in each embodiment columns 18' is equidistant at least from two columns 18 at the corners of an equilateral triangle. FIG. 4B illustrates the pattern of columns 18, 18' in transition region 14 obtained according to the second embodiment adjacent active region 10 of a device according to the present invention.

Figure 5A:
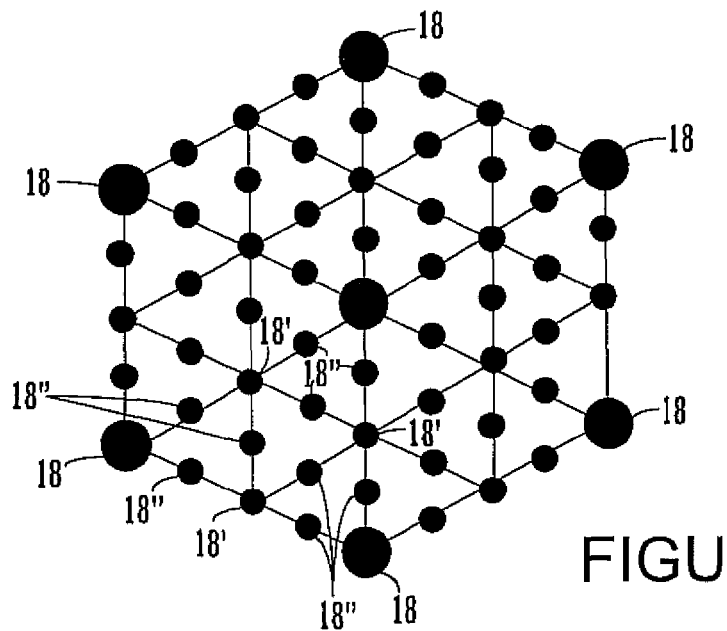
FIG. 5A illustrates a portion of the transition region in the termination region of a device according to the third embodiment of the present invention.
Figure 5B:
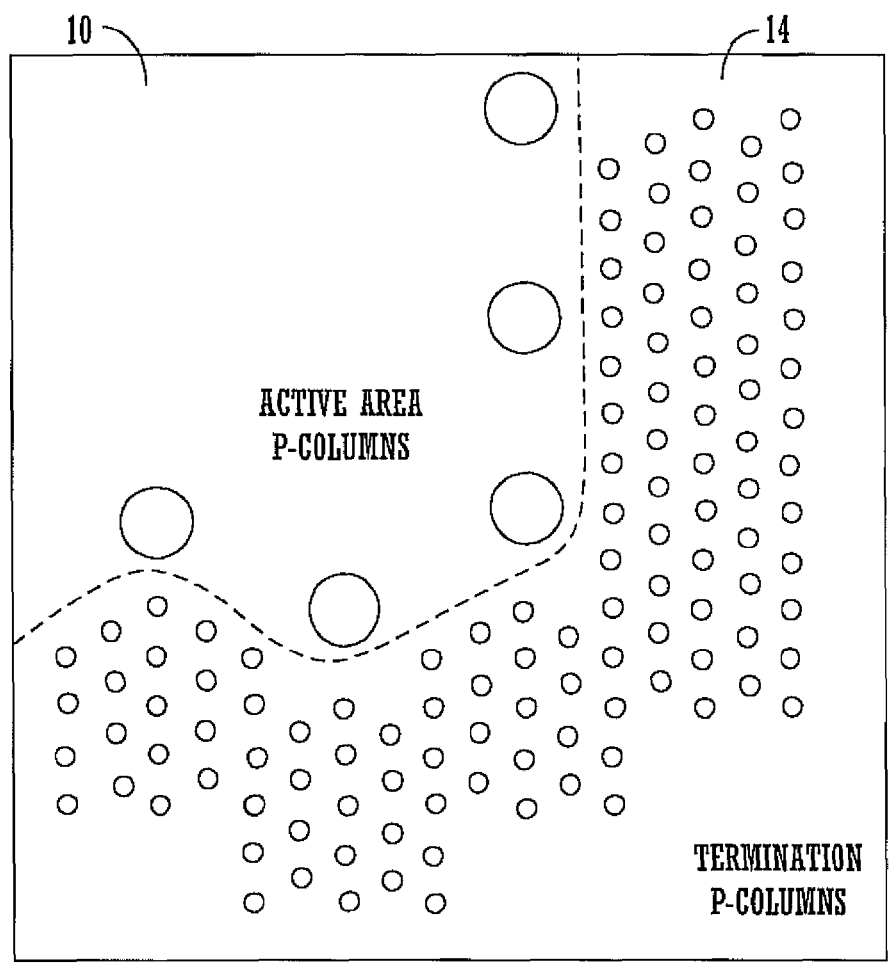
FIG. 5B illustrates a portion of the transition region according to the third embodiment adjacent the active region of the device.

Referring now to FIG. 5A, according to the third embodiment of the present invention transformation A can be repeated on a pattern according to the first embodiment by disposing columns 18" on a side of an equilateral triangle resulting from the disposition of columns 18', and/or an equilateral triangle resulting from two columns 18' and a column 18. Note that each column 18" is located equidistant from the columns at the end of the side on which it is disposed. Thus, a transformation (hereafter transformation AA) can be obtained in which transformation A is repeated to obtain a pattern according to the third embodiment of the present invention. FIG. 5B illustrates a pattern according to third embodiment adjacent active region 10 in a device according to the present invention.

Figure 6A:
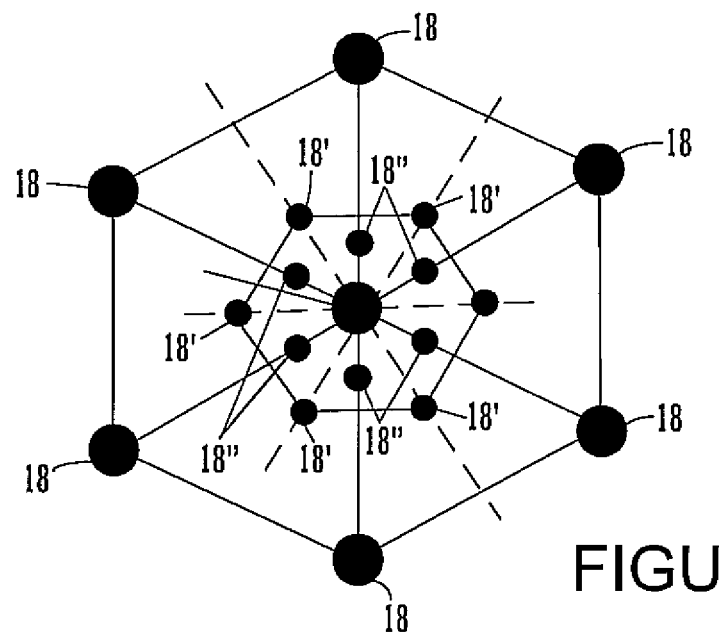
FIG. 6A illustrates a portion of the transition region in the termination region of a device according to the fourth embodiment of the present invention.

Referring now to FIG. 6A, according to the fourth embodiment of the present invention transformation B can be repeated on a pattern according to the second embodiment by disposing a column 18" at the centroid of an equilateral triangle resulting from the disposition of columns 18' and 18. Thus a transformation (hereafter transformation BB) can be obtained which results in a pattern according to the fourth embodiment of the present invention.

Figure 6B:
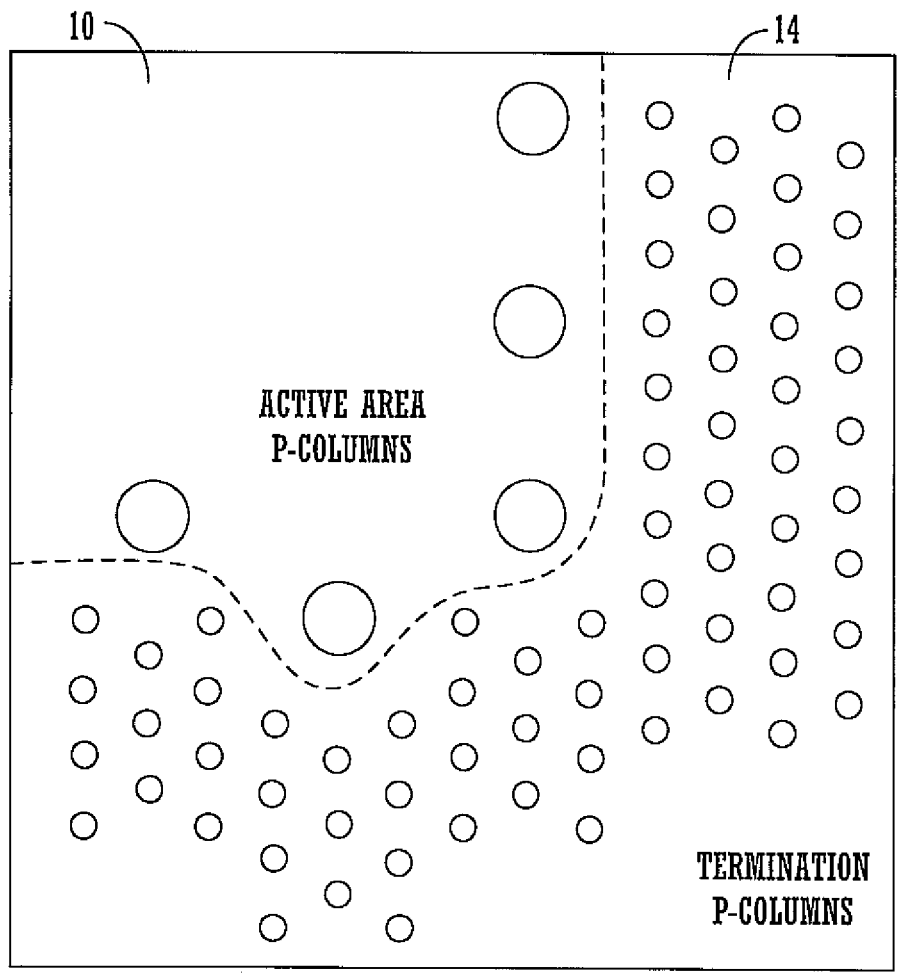
FIG. 6B illustrates a portion of the transition region according to the fourth embodiment adjacent the active region of the device.

FIG. 6b illustrates a pattern of columns obtained according to transformation BB adjacent active region 10 of a device according to the present invention.

Figure 7A:
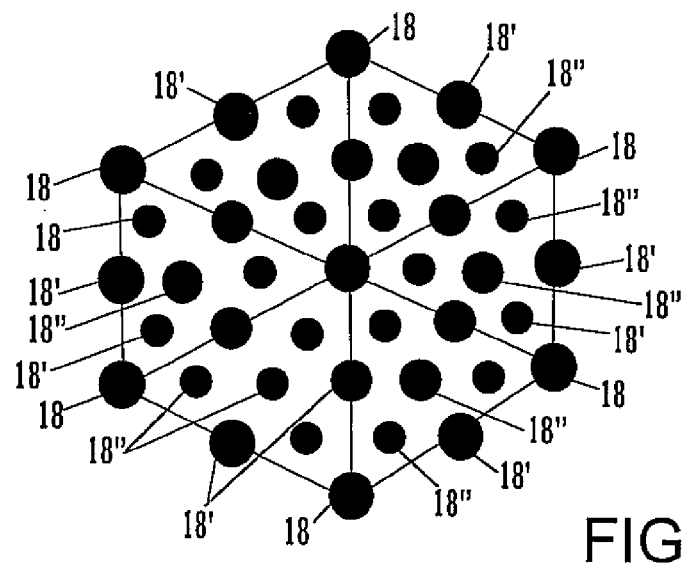
FIG. 7A illustrates a portion of the transition region in the termination region of a device according to the fifth embodiment of the present invention.

Referring now to FIG. 7A, according to the fifth embodiment of the present invention transformation B can be applied to a pattern according to the first embodiment (transformation A) by disposing a column 18" at the centroid of each equilateral triangle resulting from the disposition of columns 18' according to transformation A. Thus, a new transformation (hereafter transformation BA) can be obtained which can generate a pattern of columns according to the fifth embodiment of the present invention. Note that, because of symmetry, transformation A can be applied to a pattern obtained by transformation B (second embodiment) to obtain a pattern according to the fifth embodiment of the present invention.

Figure 7B:
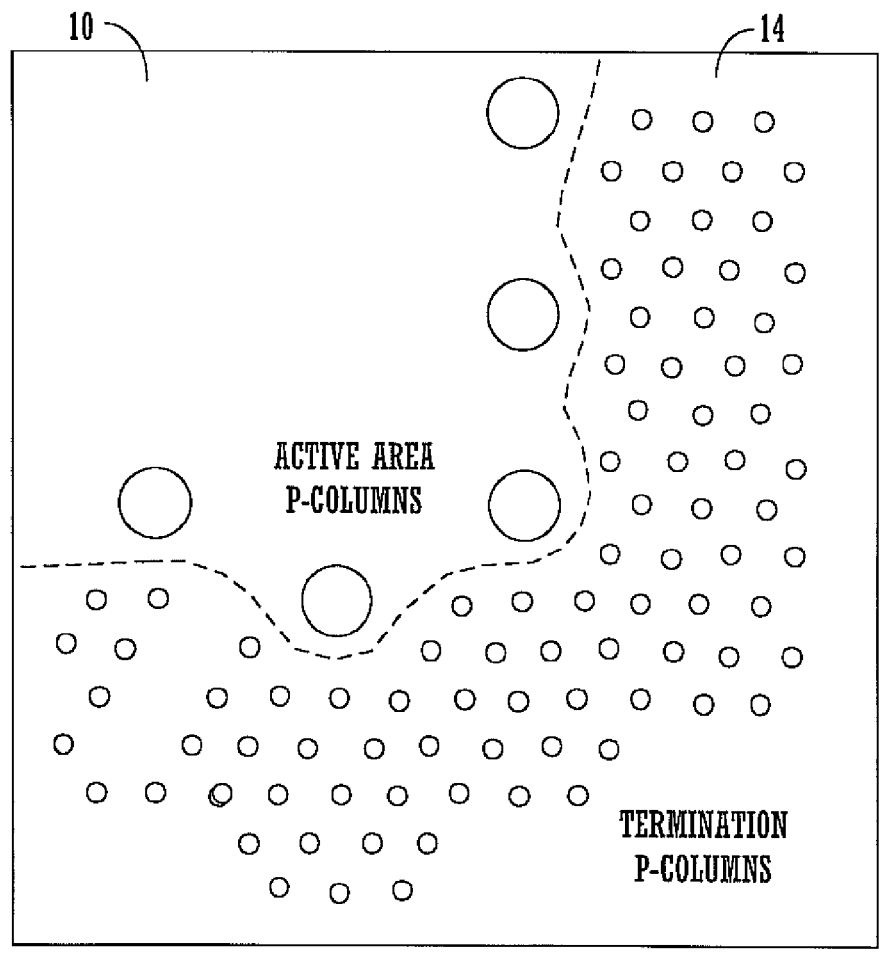
FIG. 7B illustrates a portion of the transition region according to the fifth embodiment adjacent the active region of the device.

FIG. 7B illustrates a pattern according to the fifth embodiment adjacent active region 10 in a device according to the present invention.

Note that in each embodiment the columns in the transition region are preferably of the same width, the same depth, and the same resistivity.

According to the present invention, the density of the columns in the transition region can be increased while the size (e.g. the width) thereof can be decreased resulting in an increase in the breakdown voltage. The decrease in the size of the columns in the transition region can conserve the total area (and hence charge) of the columns. For example, in the A transformation, there are four times as many columns 18,18' in the same area, so the diameter of columns can be half that of the columns in the active area. As an added advantage, the interface can be modeled to maximize the breakdown voltage by adding or removing columns 18, 18' of the denser lattice.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    a semiconductor body of first conductivity;
    an active region formed in said semiconductor body; and
    a termination region adjacent said active region, wherein said termination region comprises a first plurality of columns of a second conductivity positioned to form corners and a center of a hexagon, wherein each two adjacent columns and a column at said center of said hexagon form vertices of a first plurality of equilateral triangles, and wherein said first plurality of columns have substantially analogous resistivity.

2. The power semiconductor device of claim 1, wherein said termination region further comprises a second plurality of columns of a third conductivity, wherein each column of said second plurality of columns is positioned equidistance from two adjacent columns of said first plurality of columns.

3. The power semiconductor device of claim 2, wherein each column in said second plurality of columns is disposed on a side of a respective equilateral triangle of said first plurality of equilateral triangles.

4. The power semiconductor device of claim 3, wherein said termination region further comprises a third plurality of columns of a fourth conductivity, wherein each column of said third plurality of columns is disposed at a center of a respective equilateral triangle of said first plurality of equilateral triangles.

5. The power semiconductor device of claim 4, wherein columns of said second plurality of columns and columns of said first plurality of columns form vertices of a second plurality of equilateral triangles, wherein said termination region further comprises a fourth plurality of columns of a fifth conductivity, and wherein each column of said fourth plurality of columns is positioned at a center of a respective equilateral triangle of said second plurality of equilateral triangles.

6. The power semiconductor device of claim 3, wherein said termination region further comprises a fifth plurality of columns, wherein said second plurality of columns and said first plurality of columns form vertices of a second plurality of equilateral triangles, and wherein columns of said fifth plurality of columns are disposed on a side of a respective equilateral triangle of said third plurality of triangles, and wherein columns of said fifth plurality of columns are equidistance from two adjacent vertices of a respective equilateral triangle of said second plurality of equilateral triangles.

7. The power semiconductor device of claim 2, wherein each column of said second plurality of columns is positioned at a center of a respective equilateral triangle of said first plurality of equilateral triangles, wherein each two adjacent columns of said second plurality of columns and a column at said center of said hexagon form vertices of a third plurality of equilateral triangles.

8. The power semiconductor device of claim 7 further comprising a sixth plurality of columns of a seventh conductivity, wherein each column of said sixth plurality of columns is positioned at a center of a respective equilateral triangle of said third plurality of equilateral triangles.

9. The power semiconductor device of claim 1, further comprising a race track termination disposed around said termination region between said termination region and the edges of said semiconductor device.

10. The power semiconductor device of claim 1, wherein a breakdown voltage is increased by increasing a density of said first plurality of columns and decreasing a width of said first plurality of columns.

11. A method for improving the breakdown at the termination of a superjunction power semiconductor device, said method comprising:
    forming an active region in said superjunction power semiconductor device; and
    forming a termination region adjacent to said active region of said superjunction power semiconductor device of first conductivity, wherein said termination region comprises a first plurality of columns of a second conductivity positioned to form corners and a center of a hexagon, wherein each two adjacent columns and a column at said center of said hexagon forms vertices of a first plurality of equilateral triangles, and wherein said first plurality of columns have substantially analogous resistivity.

12. The method of claim 11, wherein said termination region further comprises a second plurality of columns of a third conductivity, wherein each column of said second plurality of columns is positioned equidistance from two adjacent columns of said first plurality of columns.

13. The method of claim 12, wherein each column in said second plurality of columns is disposed on a side of a respective equilateral triangle of said first plurality of equilateral triangles.

14. The method of claim 13, wherein said termination region further comprises a third plurality of columns of a fourth conductivity, wherein each column of said third plurality of columns is disposed at a center of a respective equilateral triangle of said first plurality of equilateral triangles.

15. The method of claim 14, wherein columns of said second plurality of columns and columns of said first plurality of columns form vertices of a second plurality of equilateral triangles, wherein said termination region further comprises a fourth plurality of columns of a fifth conductivity, and wherein each column of said fourth plurality of columns is positioned at a center of a respective equilateral triangle of said second plurality of equilateral triangles.

16. The method of claim 13, wherein said termination region further comprises a fifth plurality of columns, wherein said second plurality of columns and said first plurality of columns form vertices of a second plurality of equilateral triangles, and wherein columns of said fifth plurality of columns are disposed on a side of a respective equilateral triangle of said third plurality of triangles, and wherein columns of said fifth plurality of columns are equidistance from two adjacent vertices of a respective equilateral triangle of said second plurality of equilateral triangles.

17. The method of claim 12, wherein each column of said second plurality of columns is positioned at a center of a respective equilateral triangle of said first plurality of equilateral triangles, wherein each two adjacent columns of said second plurality of columns and a column at said center of said hexagon form vertices of a third plurality of equilateral triangles.

18. The method of claim 17 further comprising:
forming a sixth plurality of columns of a seventh conductivity, wherein each column of said sixth plurality of columns is positioned at a center of a respective equilateral triangle of said third plurality of equilateral triangles.

19. The method of claim 11 further comprising:
forming a race track termination region disposed around said termination region between said termination region and the edges of said semiconductor device.

20. The method of claim 11 further comprising:
increasing a breakdown voltage by increasing a density of said first plurality of columns and decreasing a width of said first plurality of columns.

* * * * *